US012633636B2

(12) United States Patent
Mann et al.

(10) Patent No.: US 12,633,636 B2
(45) Date of Patent: May 19, 2026

(54) HIGH FREQUENCY HETERODYNE MIXER

(71) Applicant: Thruvision Limited, Abingdon (GB)

(72) Inventors: Christopher Mark Mann, Cornwall (GB); Stephen Paul Marsh, Northampton (GB)

(73) Assignee: Thruvision Limited, Abingdon (GB)

( * ) Notice: Subject to any disclaimer, the term of this patent is extended or adjusted under 35 U.S.C. 154(b) by 943 days.

(21) Appl. No.: 17/769,000

(22) PCT Filed: Oct. 16, 2020

(86) PCT No.: PCT/IB2020/059777
§ 371 (c)(1),
(2) Date: Apr. 14, 2022

(87) PCT Pub. No.: WO2021/074890
PCT Pub. Date: Apr. 22, 2021

(65) Prior Publication Data
US 2023/0144500 A1 May 11, 2023

Related U.S. Application Data

(60) Provisional application No. 62/916,569, filed on Oct. 17, 2019.

(51) Int. Cl.
*H01P 3/08* (2006.01)
*H01P 1/213* (2006.01)
*H03D 7/02* (2006.01)

(52) U.S. Cl.
CPC ............... *H01P 3/08* (2013.01); *H01P 1/213* (2013.01); *H03D 7/02* (2013.01)

(58) Field of Classification Search
CPC .............. H01P 3/08; H01P 1/213; H03D 7/02
See application file for complete search history.

(56) References Cited

U.S. PATENT DOCUMENTS

| | | | |
|---|---|---|---|
| 4,284,967 A | 8/1981 | Yoshimura | |
| 5,265,266 A | 11/1993 | Trinh | |
| 5,446,923 A * | 8/1995 | Martinson | H03D 7/02 455/317 |
| 5,465,417 A * | 11/1995 | Tanbakuchi | H03J 3/16 455/330 |

(Continued)

FOREIGN PATENT DOCUMENTS

| | | |
|---|---|---|
| CA | 2975687 A1 | 2/2019 |
| CN | 105207625 A | 12/2015 |

(Continued)

OTHER PUBLICATIONS

Canadian Office Action issued in corresponding Canadian Application No. 3,156,478, dated Apr. 26, 2024 (4 pages).

(Continued)

*Primary Examiner* — Junpeng Chen
(74) *Attorney, Agent, or Firm* — Rothwell, Figg, Ernst & Manbeck, P.C.

(57) ABSTRACT

Devices and methods for a detection system and heterodyne mixer having a local oscillator (LO) input, a radio frequency (RF) input, an intermediate frequency (IF) output, and a suspended waveguide structure that has a quartz substrate and patterned metal transmission line with a plurality of suppression slots.

23 Claims, 11 Drawing Sheets

100

(56) References Cited

U.S. PATENT DOCUMENTS

| | | | | |
|---|---|---|---|---|
| 5,987,315 A * | 11/1999 | Nishida | H01P 5/1022 | |
| | | | 455/328 | |
| 6,144,267 A * | 11/2000 | Saitoh | H01P 5/087 | |
| | | | 333/248 | |
| 6,414,639 B1 | 7/2002 | Ho | | |
| 2003/0119471 A1* | 6/2003 | Iwatani | H01P 5/1022 | |
| | | | 455/323 | |
| 2006/0111619 A1* | 5/2006 | Castiglione | H01Q 13/0225 | |
| | | | 600/300 | |
| 2007/0069839 A1 | 3/2007 | Pathak et al. | | |
| 2007/0249292 A1 | 10/2007 | Mann et al. | | |
| 2013/0342841 A1 | 12/2013 | Milind et al. | | |
| 2014/0037045 A1 | 2/2014 | Ehud et al. | | |
| 2014/0300430 A1 | 10/2014 | Feldman | | |
| 2019/0363415 A1* | 11/2019 | Shen | H01P 1/387 | |

FOREIGN PATENT DOCUMENTS

| | | | |
|---|---|---|---|
| EP | 3686577 A1 | 7/2020 | |
| GB | 2284941 A | 6/1995 | |
| JP | H10-75109 A | 3/1998 | |
| JP | 2000-151228 A | 5/2000 | |
| JP | 2009534975 A | 9/2009 | |
| JP | 2019-60841 A | 4/2019 | |
| WO | 2007122413 A1 | 11/2007 | |

OTHER PUBLICATIONS

International Search Report and Written Opinion issued in International Application No. PCT/IB2020/059775, dated Mar. 19, 2021 (22 pages).

C. H. Smith III et al., "Development of a Multi-Layer SU-8 Process for Terahertz Frequency Waveguide Blocks", 2005 IEEE MTT-S International Microwave Symposium, IEEE, Jun. 12, 2005 (Jun. 12, 2005), p. 439-442.

International Search Report and Written Opinion issued in International Application No. PCT/IB2020/059777, dated Mar. 18, 2021 (16 pages).

L. E. Dickens et al., "A New 'Phased-Type' Image Enhanced Mixer", Microwave Symposium, 1975 IEEE-MTT-S International, IEEE, May 12, 1975 (May 12, 1975), pp. 149-151.

Ashok Kumar et al., "Millimetre-Wave Single Side Band Upconverter in Hybrid Transmission Media" International Journal of Electronics, vol. 73, No. 2, Aug. 31, 1992 (Aug. 31, 1992), pp. 407-415.

Anthony Kerr et al., "Development of the ALMA Band-3 and Band-6 Sideband-Separating SIS Mixers", IEEE Transactions on Terahertz Science and Technology, IEEE, vol. 4, No. 2, Mar. 31, 2014 (Mar. 31, 2014), pp. 201-212.

Japanese Office Action issued in corresponding Application No. 2022-523158, dated Sep. 3, 2024, with an English translation, 24 pages.

International Preliminary Report on Patentability issued in International Application No. PCT/IB2020/059777, dated Apr. 19, 2022 (12 pages).

* cited by examiner

400

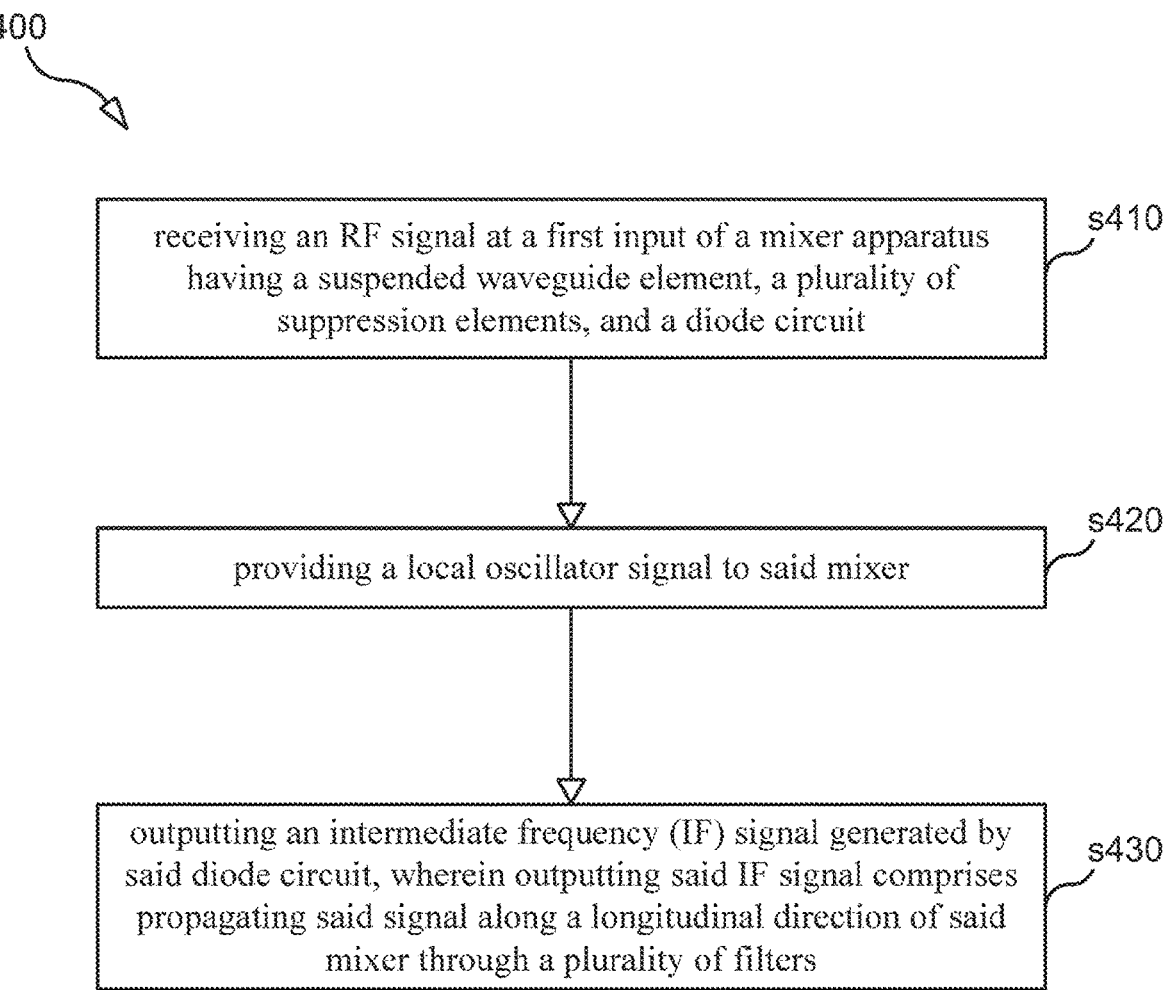

receiving an RF signal at a first input of a mixer apparatus having a suspended waveguide element, a plurality of suppression elements, and a diode circuit    s410 providing a local oscillator signal to said mixer    s420 outputting an intermediate frequency (IF) signal generated by said diode circuit, wherein outputting said IF signal comprises propagating said signal along a longitudinal direction of said mixer through a plurality of filters    s430

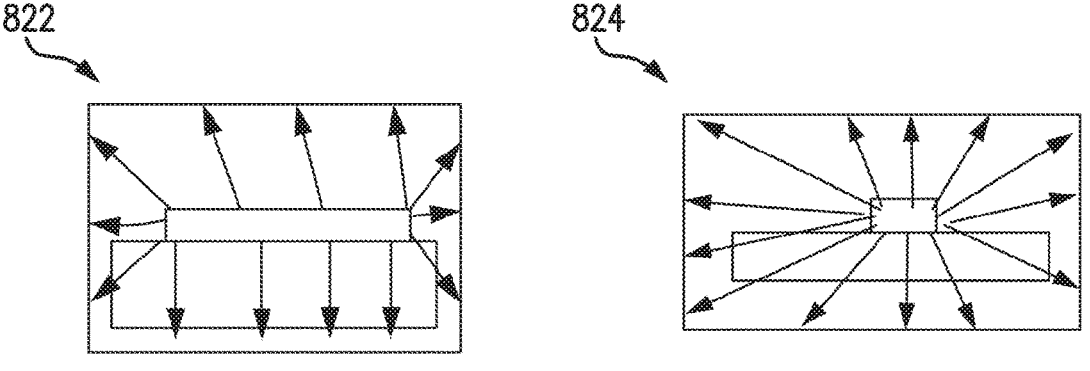
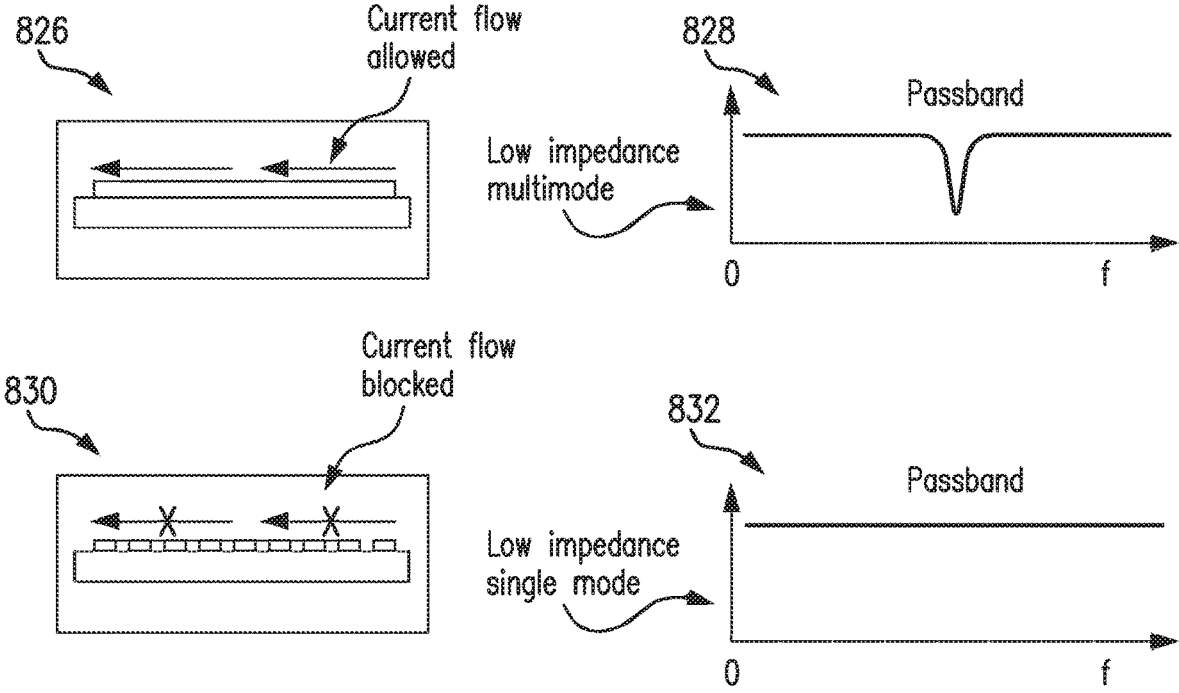
FIG. 8B

HIGH FREQUENCY HETERODYNE MIXER

CROSS REFERENCE TO RELATED APPLICATION(S)

This application is a 35 U.S.C. § 371 National Stage of International Patent Application No. PCT/IB2020/059777, filed Oct. 16, 2020, designating the United States, which claims the benefit of U.S. Provisional Application Ser. No. 62/916,569, filed Oct. 17, 2019, the disclosures of which are incorporated herein in their entirety by reference.

TECHNICAL FIELD

This disclosure relates to high frequency electronics and detection systems, and in particular, heterodyne mixers and methods of fabricating the same.

BACKGROUND

A mixer is an electronic device that can be used to generate output signals having frequencies different than the frequencies of received signals. For example, where two input signals are applied to a mixer, the mixer may generate output signals having frequencies at the sum and difference of the input signals, or harmonics thereof. In this way, a mixer can be used to down-convert a detected signal to a lower frequency, for instance, to simplify subsequent processing.

A mixer is shown in WO 2007/125326 that receives an incoming radio frequency (RF) signal, receives a local oscillator (LO) signal, and produces an intermediate frequency (IF) signal from a diode chip. This design uses separate RF, LO and IF circuit pathways, as well as wire-based stub tuners to optimize conversion efficiency and for power matching.

However, there remains a need for a mixer design that is effective across a wide range of frequencies (e.g., at very high frequencies) and that is compatible with the fabrication and assembly techniques used for small components, such as the small components needed when circuit elements scale with the reduction in signal wavelength for a given system.

SUMMARY

According to embodiments, a mixer apparatus, such as a heterodyne mixer, is disclosed. The mixer may comprise a first input, such as a local oscillator (LO) input; a second input, such as a radio frequency (RF) input; an output, such as an intermediate frequency (IF) signal output; a suspended signal transmission element comprising a plurality of suppression slots and filter elements; and a diode circuit mounted on the suspended signal transmission element. The suspended signal transmission element may be, for instance, waveguide. In certain aspects, the suspended signal transmission element is a waveguide comprising a substrate having a first and second surface and a transmission line on the first surface, where the substrate is a quartz substrate and the transmission line is a patterned metal microstrip (also referred to as stripline) transmission line. Further, the first input (e.g., LO) can be located between the second input (RF) and the output (e.g., IF), and the transmission element can be configured to transmit an IF signal generated in the diode circuit along a longitudinal axis of the transmission element from the diode circuit to the output.

According to embodiments, a heterodyne mixer apparatus has a waveguide component, where the waveguide component comprises filtering means, transmission means, and suppression means. One or more semiconductor devices can be mounted on the surface of the waveguide component.

According to embodiments, a mixer with one or more slotted filter elements is provided. In certain aspects, slots in the filter are relatively small compared to the free-space wavelength. For example, the slots may be less than λ/10.

According to embodiments, a mixer is provided having an RF signal input at a first end, an IF signal output at a second end, and an LO signal input between the two ends (e.g., in the middle). In certain aspects, a waveguide transmission element runs from the first end to the second end. The transmission element may be suspended, and may also have a plurality of suppression slots and filter elements. Further, a diode circuit may be mounted at the first end of the mixer and proximate the RF signal input. In some embodiments, IF signals generated in the diode circuit propagate along the transmission element to the IF signal output at the other end of the mixer. The mixer may be arranged in a detector block with RF and LO input channels along a first axis, and IF outputs along a second axis that is perpendicular to the first.

According to some embodiments, a detector, such as a terahertz camera, is provided. The detector may include, for example, one or more of the mixers described herein; one or more feedhorns coupled to the input (e.g., providing RF signal) of at least one of the mixers; a local oscillator coupled to another input of at least one of the mixers; a coaxial line (or other transmission element) coupled to the output (e.g., IF) of at least one of the mixers; and one or more of a low noise amplifier (LNA), power detector, and analog-to-digital converter (ADC) circuit elements connected to the coaxial line and configured to process the output IF signal. The detector may further include additional filtering and image processing, for instance, to generate an image of an object or scene from which the input radiation was received. In certain aspects, the one or more mixers comprise a plurality of mixers optimized at 250 GHz and a plurality of mixers optimized at 375 GHz. The set of mixers can further comprise a plurality of mixers optimized at 125 GHz.

According to some embodiments, a method of operating a mixer is provided. The method can include, for example, the steps of receiving an RF signal at a first input of a mixer apparatus having a suspended transmission line element, a plurality of suppression elements, and a diode circuit; providing a local oscillator signal to the mixer; and outputting an IF signal generated by the diode circuit, wherein outputting the IF signal comprises propagating the signal along a longitudinal direction of the mixer through a plurality of filters.

According to some embodiments, a method of fabricating a mixer apparatus, such as one or more of the mixers described herein, is provided. The method may begin with machining steps, including: (1) machining a first housing component comprising a first radio frequency channel portion, a first local oscillator portion, a first intermediate frequency channel portion, a first cavity portion, a first mounting shelf portion, and a second mounting shelf portion; and (2) machining a second housing component comprising a second radio frequency channel portion, a second local oscillator portion, a second intermediate frequency channel portion, a second cavity portion, a third mounting shelf portion, and a fourth mounting shelf portion. A signal transmission element (e.g., waveguide) can be suspended in the first and/or second cavity portion by mounting the waveguide element on the first and second mounting shelf portions and/or the third and fourth mounting shelf portions.

Additionally, the first housing component can be attached to the second housing component to form a block. The block may be, for example, a receive array block of a detector, such as a terahertz camera.

According to embodiments, a detector block is provided that comprises a housing and one or more mixers mounted in the housing. The housing may comprise one or more feedhorns coupled to an RF input of at least one of the mixers, one or more local oscillator channels coupled to an LO input of at least one of the mixers, and one or more output channels coupled to an IF output of at least one of the mixers, One or more of the mixers may comprise a suspended signal transmission element mounted on first and second mounting structures of the housing. In some embodiments, the one or more feedhorns and the one or more local oscillators channels extend along a first axis of the housing, the one or more output channels extend along a second axis of the housing, and the first axis and second axis are perpendicular. Additionally, the suspended signal transmission element may comprise: a substrate having a first and second surface; and a transmission line on the first surface, wherein the transmission line is a patterned metal microstrip transmission line comprising one or more suppression slots and the filter elements.

According to embodiments, a terahertz camera is provided that comprises: one or more mixers comprising an IF output, an LO input, and an RF input; one or more feedhorns coupled to an RF input of at least one of the mixers; a local oscillator coupled to an LO input of at least one of the mixers; and one or more of a low noise amplifier, power detector, and analog-to-digital converter connected to an IF output and configured to process an output IF signal from at least one of the mixers. Additionally, at least one of the mixers may further comprise: a suspended signal transmission element comprising a plurality of suppression slots and filter elements; and a diode circuit mounted on the suspended signal transmission element and configured to generate the IF output signal based on radiation received on one or more of the feedhorns and a power signal from the local oscillator. In some embodiments, the received radiation is in a band centered around 125 GHz, 250 GHz or 375 GHz.

BRIEF DESCRIPTION OF THE DRAWINGS

The accompanying drawings, which are incorporated herein and form part of the specification, illustrate various embodiments.

FIG. 4 is a flow chart illustrating a process according to some embodiments.

FIGS. 8A and 8B illustrate microstrip fields and currents according to some embodiments.

DETAILED DESCRIPTION

Figure 1:
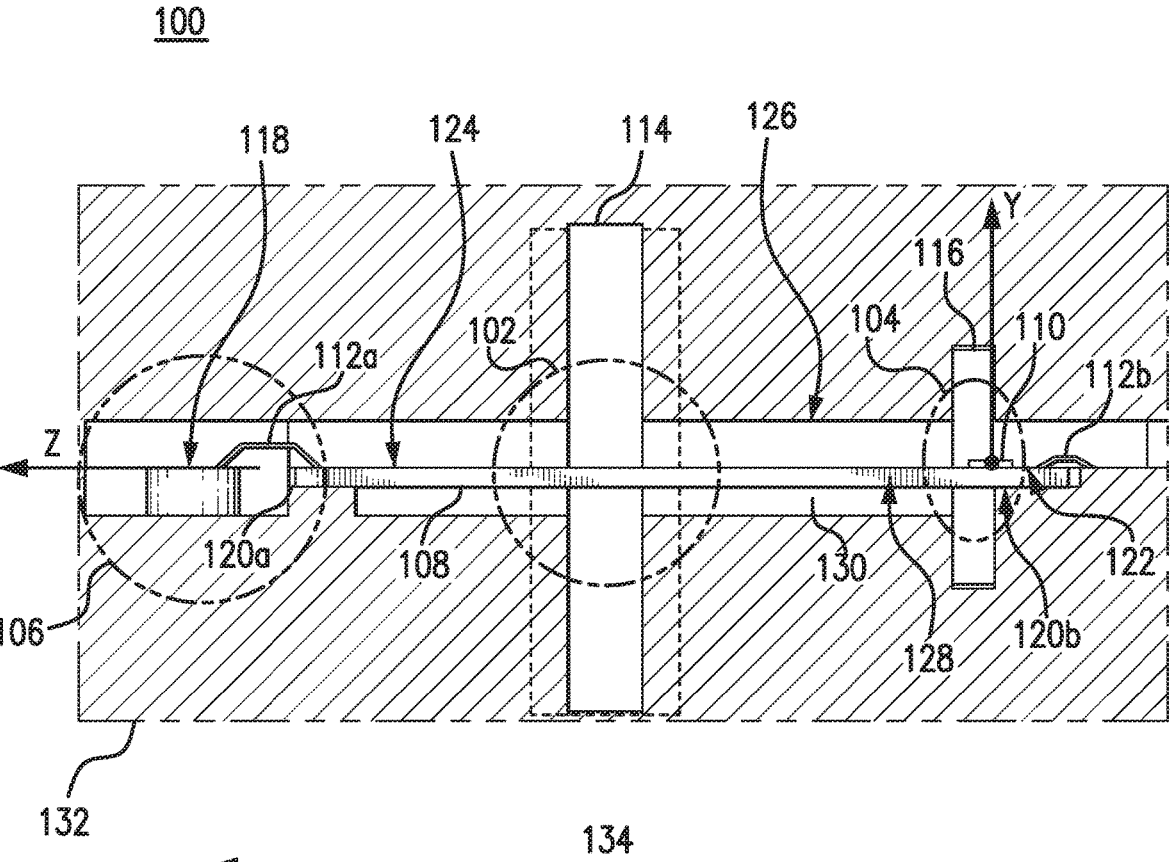
FIG. 1 illustrates a mixer apparatus according to some embodiments.

The sensing of microwave, millimeter, and/or submillimeter signals from an object or scene can require extremely sensitive detectors. For instance, the power levels of received signals can be in the femtowatt range.

In some instance, for example at certain microwave frequencies, a low noise amplifier can be used to increase the power level of the signal by orders of magnitude (e.g., 100-1000 fold) such that it can then be processed to produce a DC voltage. This DC voltage can then be further amplified until it is sufficiently strong that it can be converted to a digital value that can then be used to create image data. Other detection schemes can be used such as bolometers, which are effectively highly sensitive thermometers that produce a voltage directly proportional to a scene's power level. Where power levels are quite low, bolometers may require cooling to very low temperatures, typically less than 20 degrees Kelvin, so that the weak received signal is enhanced against the intrinsic noise of the bolometer itself (caused by the random movement of the electrons caused by thermal vibration of the atoms/molecules in the material used for the bolometer). This cooling requirement can require complex cryogenic technology, which not only adds significant cost, volume, and mass but may also require significant power levels. Thus, the applications for bolometer-based imaging may be limited. For example, many security and material inspection applications require a high degree of portability from the system which in turn requires low mass, volume, and power.

At higher frequencies, such as millimeter and submillimeter wavelengths, high gain, low noise amplifiers can be difficult to operate at room temperature with sufficiently high performance to achieve passive imaging in real time. Additionally, as the frequency increases, so too does the path length of the amplifier gate, requiring smaller and smaller devices. This in turn leads to high resistance and increased signal loss and noise, with a reduction in gain. If the operational frequency is increased by a factor of two, the area of a circuit is typically reduced by a factor of four, and its volume by a factor of eight. Thus, even modest increases in frequency can introduce fabrication and assembly challenges, which in turn degrade reproducibility and yield thereby increasing cost. Such frequency increases can also reduce the extent to which conventional assembly tools are practical for machining of high frequency components.

By way of example, a quartz filter used to separate the RF, LO and IF signals can become extremely small and difficult to handle at frequencies in excess of 250 GHz. Also, if bond wires are needed to "tune" the three signals of a heterodyne mixer, the wires and connections become difficult to realize in a routine manner, which is compounded by the need for bond wires to be correctly dimensioned in order for all three signals to be optimized. Additionally, if a filter, such as an IF filter, is formed by high and low quarter wave impedance sections realized on an IF output pin, it can complicate the assembly, increasing costs and assembly time.

According to embodiments, certain problems with existing systems are solved through the use of a mixer to down-convert a detected signal to a lower (e.g., lower microwave) frequency such that it can then be amplified and processed. According to embodiments, a mixer can achieve high down-conversion efficiency from the RF signal to the IF signal, while using a minimum amount of LO signal power. In certain aspects, the disclosed designs can minimize the amount of signal reflected at the IF output (i.e., there is good IF match). In certain aspects, a good IF match may mean that a mixer circuit under LO pumped conditions (i.e., during operation) is at approximately 50 ohms. In some instance, this may be the same impedance as one or more IF amplifiers.

According to embodiments, designs at higher frequencies can be routinely manufactured and assembled, with a circuit that simultaneously provides improved performance by isolating the effect of circuit elements on each other while providing increased scope for circuit optimization. By increasing the size available on the filter substrate, there can be reductions in the ohmic resistance of the filter metallization. This can in turn reduce the amount of signal that would otherwise be lost in a smaller circuit.

In some embodiments, wideband transverse waveguide is used at both LO and RF microstrip junctions to provide a simplified circuit layout and topology. Odd-mode and transverse-mode suppression slots can be used in conjunction with an air suspended microstrip filter topology having low impedance sections of one or more filter circuits. In certain aspects, this allows wide filter channels to be used, easing machining tolerances, improving fabrication yields, and reducing assembly complexity.

A quartz filter circuit can be achieved using the microstrip circuit configuration. According to embodiments, the signals propagate in the longitudinal direction in the fundamental order Transverse Electromagnetic Mode (TEM-00), in which there are no components of the electromagnetic field existing in the longitudinal direction even though all transfer of power is in that direction. In order to propagate a TEM-00 mode, and in some embodiments, the microstrip configuration consists of two conductors that are sufficiently small as to prevent the propagation of higher order modes. These conductors can comprise the outer wall of the filter channel and the inner filter metallization. In this geometry, the fields can be calculated using finite element analysis for each cross section and their combination. As the size of the outer conductor increases with respect to the signal wavelength, which may be desirable for the reasons highlighted herein, higher order TEM-nn modes such as the odd modes (e.g., TEM-01 and TEM-10) can be generated. As the signals propagate down the filter channel, such higher order odd modes can create blocking resonances between filter cross sections that degrade the broadband performance. Wave propagation in the transverse direction can also result in a loss of power transfer between the mixer circuit elements. Moreover, use of the widest possible cross section can increase the possibility of odd-order modes and transverse wave propagation. However, for odd-order TEM modes and transverse wave propagation to occur, there is a need for lateral surface currents across the geometry (e.g., the filter conductor geometry). Thus, by incorporating longitudinal slots, for example in a first filter element, unwanted modes and propagation can be suppressed.

According to some embodiments, the use of a wide longitudinal filter common center line feed can minimize ohmic losses in all three signals (LO, RF, IF). Additionally, the use of a capacitive, inductively-tuned short circuit pad used in conjunction with a physical DC ground can lock all three signal paths to ground in the shortest length, thereby increasing the intrinsic bandwidth of the entire circuit. This can negate, for instance, the need for individual tuning bonds/wires for each frequency, further minimizing ohmic losses.

Referring now to FIG. 1, a cross-sectional illustration of a mixer 100 according to some embodiments is provided. The mixer 100 may be, for example, a heterodyne mixer, including a superheterodyne, harmonic, and/or subharmonic mixer. In some embodiments, a balanced mixer design may be used.

The mixer 100 may include a first input 102, such as an LO input, a second input 104, such as an RF input, and a signal output 106, such as an output for an IF signal. According to embodiments, the first input 102 may be the portion of mixer 100 configured to couple a signal from a local oscillator via an LO waveguide 114, which delivers the LO signal to the mixer 100. In some embodiments, waveguide height reduction and matching elements can be used to impedance match the LO signal to the mixer. Additionally, the second input 104 may be the portion of the mixer 100 configured to couple a signal from a radio frequency source via an RF waveguide 116. In certain aspects, the RF waveguide 116 delivers RF signal as part of a detection system, for instance, via one or more feedhorns of a high frequency camera. In certain aspects, the inputs 102, 104 may be antennas. An example of machined signal paths coupled to the mixer inputs and outputs is provided in FIG. 6A. Although illustrated with waveguide inputs and antennas, one or more of the LO and RF signals may be delivered to the mixer 100 using other transmission elements, such as co-axial line or co-planar line. As shown in the example of FIG. 1, a mixer is provided with an RF input at one end, an IF output at an opposite end, and an LO input in between (e.g., in a central portion of the mixer).

The signal output 106 provides the output signal from the mixer circuitry, such as diode circuit 110. In some embodiments, the diode circuit 110 comprises two Schottky diodes, in an anti-parallel configuration. However, other circuits may be used. In some embodiments, an IF signal from the diode circuit 110 is output from the mixer 100 via a coaxial connection, for instance, connection element 118 in an output channel. Alternatively, the IF signal could be output using one or more of waveguide or other wired connections depending on frequency. The IF signals can be transmitted from the diode circuit 110 to the output 106 along the length of the suspended transmission line element 108, as illustrated by direction arrow 134. In this arrangement, the LO input 102 is interposed between the RF input 104 and the IF signal output 106. According to embodiments, the RF input 104 is situated at a first distal end of the mixer 100 and waveguide element 108, the IF output 106 is situated at a second distal end of the mixer 100 and waveguide element 108, and the LO input 102 is situated in a center region of the mixer 100 and waveguide element 102.

Figure 2A:
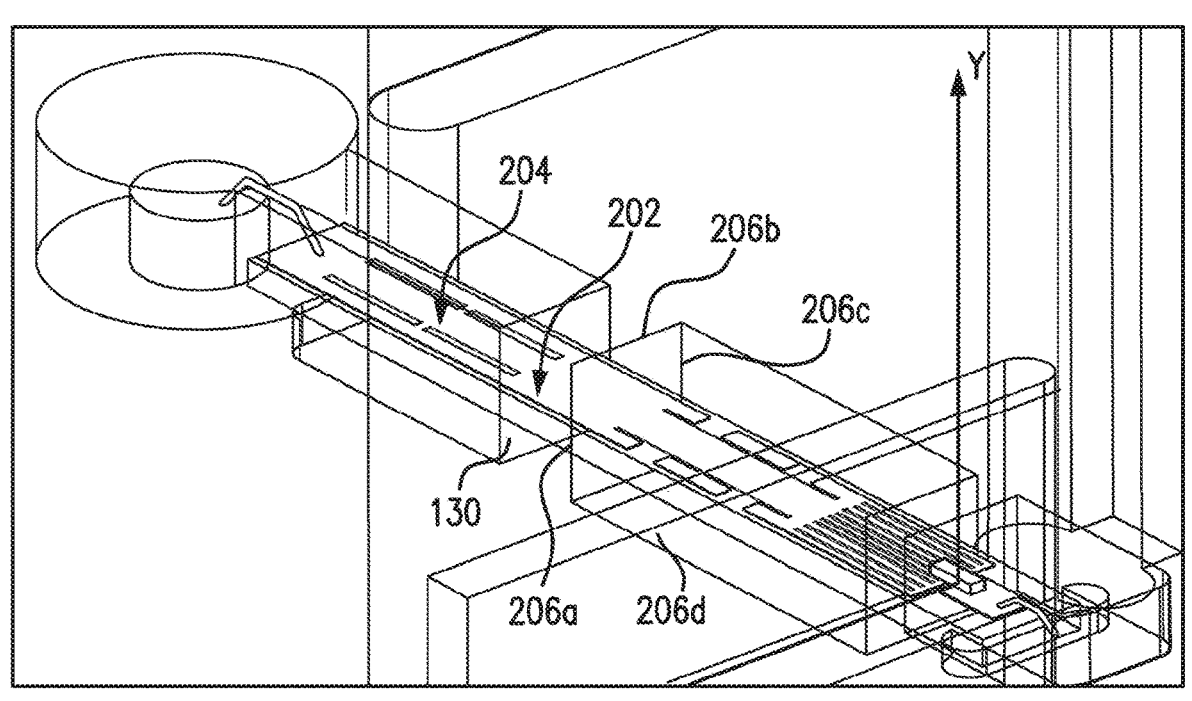
FIGS. 2A and 2B illustrate a mixer apparatus according to some embodiments.

According to embodiments, mixer 100 comprises a suspended element 108 that is waveguide, and which is mounted via substrate mounts 120a and 120b in a cavity of the mixer housing 132. In this way, an airgap 130 is provided on at least two sides of the suspended waveguide element 108 (e.g., above and below). As another example, and as illustrated in FIG. 2A, the suspended waveguide element 108 may have an airgap 130 on all four sides. One or more of the substrate mounts may be flat, such as mount 120a, or stepped, such as mount 120b. The waveguide element 108 may comprise a substrate portion and a patterned metal surface portion. For instance, the substrate may be quartz (or another suitable dielectric, such as aluminum nitride) with a patterned gold layer forming a microstrip transmission line. Other suitable transmission line materials could include other metallic or otherwise conductive materials. The diode circuit 110 may be mounted on the patterned metal surface of the waveguide element 108, for instance, at least partially within RF input 104. In some embodiments, the suspended waveguide element 108 includes suppression slots, which are configured to suppress unwanted transmission and resonance modes. In some embodiments, the housing 132 may comprise a block or portion of a block, such as a detection array block. For instance, blocks 514, 600, 620, and 650 may comprise the housing illustrated in FIGS. 1-3.

According to embodiments, the signals may propagate on the surface of the suspended waveguide element 108 along the transmission line through one or more filters. For instance, the suspended waveguide element 108 may include an LO filtering/suppression portion 124, an RF filtering/suppression portion 126, and an RF reception element (e.g., antenna) 128, which may be part of RF input 104. The LO filtering/suppression portion 124 may filter LO signals from reaching the IF output 106. This can enable, in some embodiments, the removal of the need for a separately machined LO and/or IF coaxial filter pin. The RF filtering/suppression portion 126 may filter RF signals from reaching the IF output 106 and/or filter spurious signals from reaching the diode circuit 110. Additionally, the RF reception element 128 may be configured with a plurality of slots (e.g., suppression slots). In some embodiments, the suppression slots used along the surface of the suspended waveguide element 108 extend in a longitudinal direction and suppress odd mode propagation. For example, slotted features within a stripline can inhibit electric current from flowing across the width of the suspended waveguide element 108, thereby preventing un-wanted odd-modes from propagating along the stripline towards IF output 106. According to embodiments, a desired even-mode propagation of the IF signal is unaffected by the suppressions slots.

In some embodiments, the slots have a width of less than λ/10, and a length of at least ¼λ.

According to embodiments, slotted features within the microstrip circuit inhibit electric currents from flowing across the width of the microstrip metal and prevent unwanted odd-modes from propagating along the microstrip circuit. However, the desired even-mode propagation can be left unaffected by the slots.

As illustrated in FIG. 1, the mixer 100 comprise one or more mounting structures 120*a*, 120*b* for the suspended waveguide element 108. Thus, and according to embodiments, the filters of the mixer are suspended at the ends of the stripline rather than on the sides. Thus, there can be less dielectric substrate within the cavity so that the higher modes are moved above the operating frequency of the mixer. Also, and in some embodiments, the sides of the channel cavity are flat and less likely to perturb the filter characteristics.

According to embodiments, one or more of the filters of mixer 100 couple to the top and/or bottom of the housing cavity in which the mixer is mounted. For instance, the suspended-stripline filters can be designed such that the filter sections couple primarily to the top or bottom of the cavity rather than the sides of the cavity. This improves the manufacturability of the mixer because the filter characteristics are more dependent upon the size of the filter features than the size of the machined channels (or assembled position within the channel). The filter features can be easier to control accurately because they are defined by photolithography, for instance. In some embodiments, the suspended waveguide's width comprises 90% or more of the housing 132 cavity's width. In certain aspects, the presence of the dielectric under the edges of the metallization can cause the filter sections to couple primarily to the sides of the cavity. According to embodiments, the cavity walls are moved further away from the filtering elements by suspending the substrate. However, the dielectric sucks the field lines to the sidewall at the edges of the metallization. The associated current density is therefore higher at the edges where there are no slots, minimizing the ohmic loss they would otherwise cause. For example, a filter section 124 has a wide center strip 204 with slots that are spaced apart from the edges of the suspended transmission line 108, as illustrated in the example of FIG. 2A.

Figure 8A:
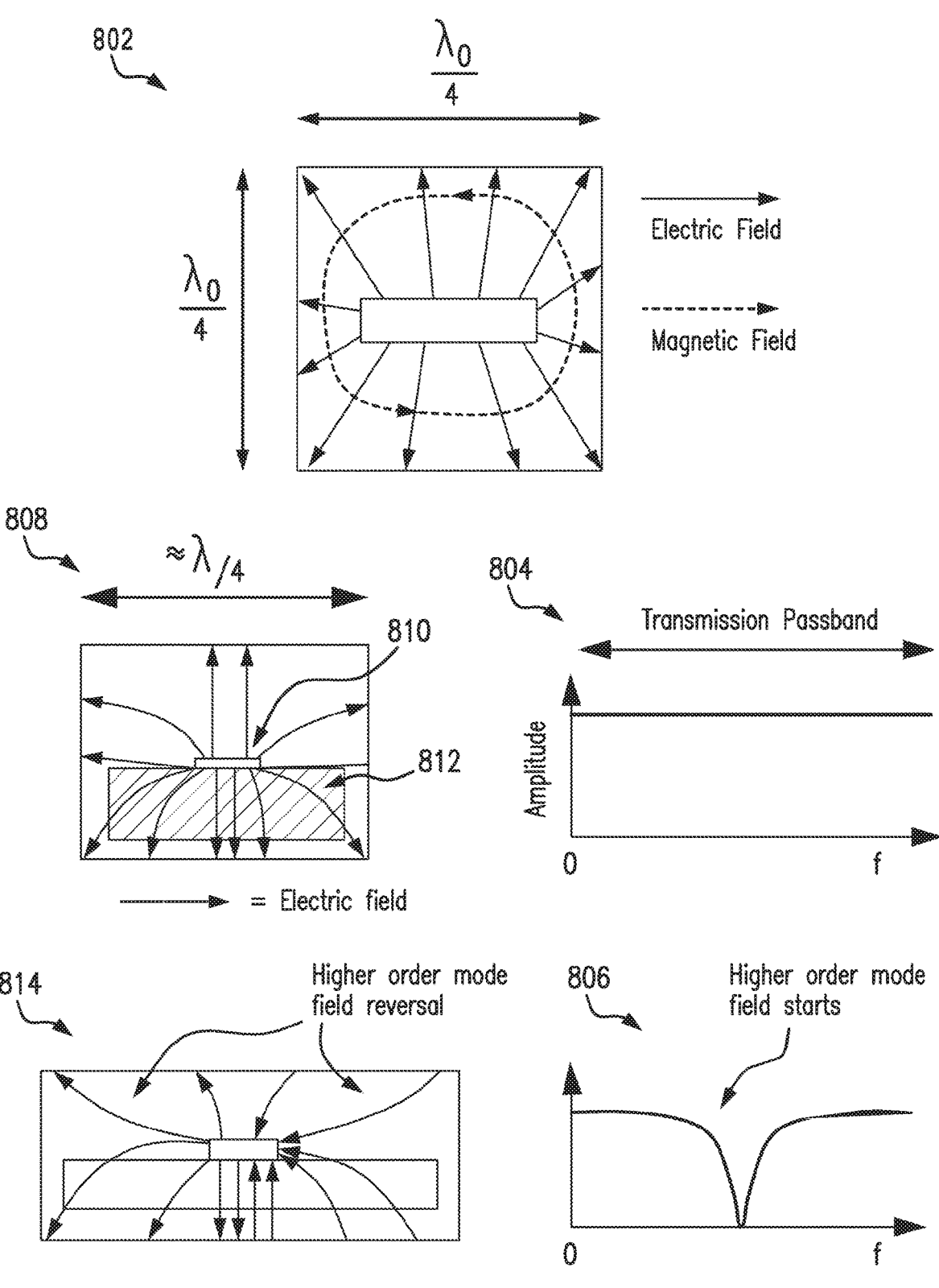

According to embodiments, through the use of one or more slotted features near the transition between the microstrip quartz circuit and the waveguide (e.g., where the diode sits across a gap), suppression of higher-order transverse electromagnetic (TEM) modes that could propagate longitudinally down the microstrip circuit is provided. According to embodiments, this is achieved by breaking the transverse surface current path across the centre conductor by introducing gaps. However, the longitudinal propagation of the desired fundamental mode is unaffected because there is no transverse current for the fundamental mode. Aspects of this feature are illustrated in FIGS. 8A and 8B. In some implementations, without these features, the higher order modes would introduce resonances into the low impedance section of the filter's passband, which can restrict the bandwidth limiting the filters operational bandwidth and thereby the bandwidth of the overall mixer.

In some embodiments, the mixer 100 further includes ground connection 112*a* and 112*b*. This may be, for instance, via a wired connection. The mixer 100 may further include a tuned short-circuit pad 122. In some embodiments, a ground connection 112*b* is made from the pad 122 to housing 132. Additionally, one side of diode circuit 110 may be mounted to the pad 122.

With respect to tuned short-circuit pad 122, and according to some embodiments, one end of the stripline circuit is capacitively coupled to ground via a rectangular pad of metal, through the stripline substrate, to the metal shelf it is resting on. This connects the circuit to ground as an effective short circuit at the detected signal (RF) and LO millimeter-wave frequencies through capacitive coupling. This capacitive coupling can reduce the effect of bondwire assembly variations on the ground point for the LO and RF signals. The bond wire from this pad to the metal step connects the circuit to ground at lower frequencies (low microwave) and DC. This allows a much shorter length of line, thus providing broader bandwidth that can be achieved with minimum bond lengths and number.

According to embodiments, a separately machined LO and/or IF coaxial filter pin is not required.

In certain aspects, in order to achieve the widest bandwidth possible, a ground connection is presented to all signals with a minimum length close to the ground-side of the diode circuit 110. Such a connection was traditionally achieved using a "virtual" reactive comprising tuning stubs using bond wires that are multiples of ¼$^{th}$ λ, at the LO and signal frequencies. However, and according to embodiments, the IF signal also has a short ground length in order to achieve a broadband match, which may be incompatible with traditional techniques. To achieve the ideal ground at all frequencies, including at the LO and signal frequencies which are sufficiently high, a virtual broadband short is achieved in some embodiments at both frequencies using a combination of the capacitance of the bond wire pad and the inductance of the short bond wire. In this embodiment, the IF signal is too low in frequency to be affected by the capacitance of the bond pad or the inductance of the bond wire and as the physical length is very short compared to the IF wavelength (e.g., less than λ/10) and a broadband physical short is achieved.

Figure 2B:
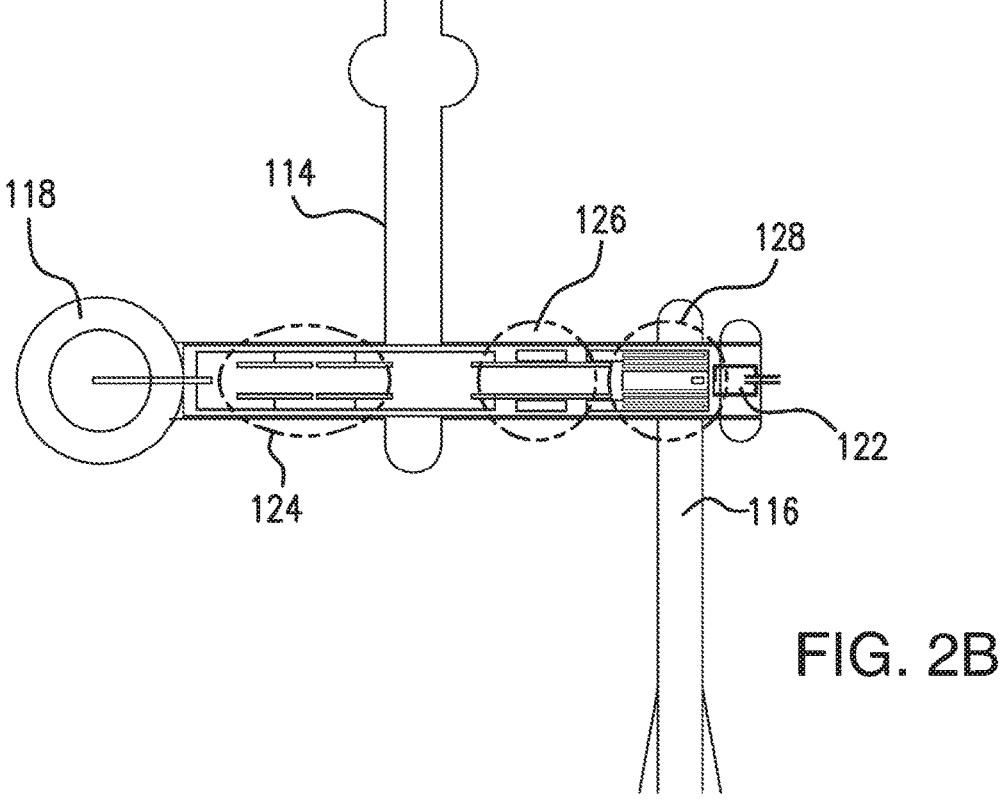

FIGS. 2A and 2B show the upper surface of suspended waveguide 108 within the housing 132 of mixer 100. For instance, the figures illustrate a patterned metal layer on a substrate to form a waveguide path for signals within the mixer. In FIG. 2B, the diode circuit 110 is omitted to illustrate the pad structure.

As shown in FIG. 2A the upper surface of the suspended waveguide 108 can include a microstrip transmission line 202, which includes a wide center strip 204. In this example, the airgap 130 in the housing 132 is provided on four sides around the suspended waveguide 108 to form a cavity. The sides of the cavity are shown, for instance, as cavity side-walls 206a-d. In the top view image of mixer 100 shown in FIG. 2B, the coupling of waveguides 114 and 116, and coaxial connection 118, are further shown. While a coaxial connection is shown as an example, other output channels may be used. According to embodiments, the input channels can extend along a first direction, while the outputs extend along a perpendicular direction, as shown for instance in FIG. 6A. The waveguides 114 and 116 may be in a first plane, while the output channel (e.g., with coaxial connection 118) is in a second, orthogonal plane. In this example, the LO input waveguide 114 bisects the mixer. The slotted features illustrated in FIGS. 2A and 2B can correspond, in some embodiments, to an LO filtering/suppression portion 124, an RF filtering/suppression portion 126, and an RF reception element (e.g., antenna) 128.

Figures 3A, 3B:
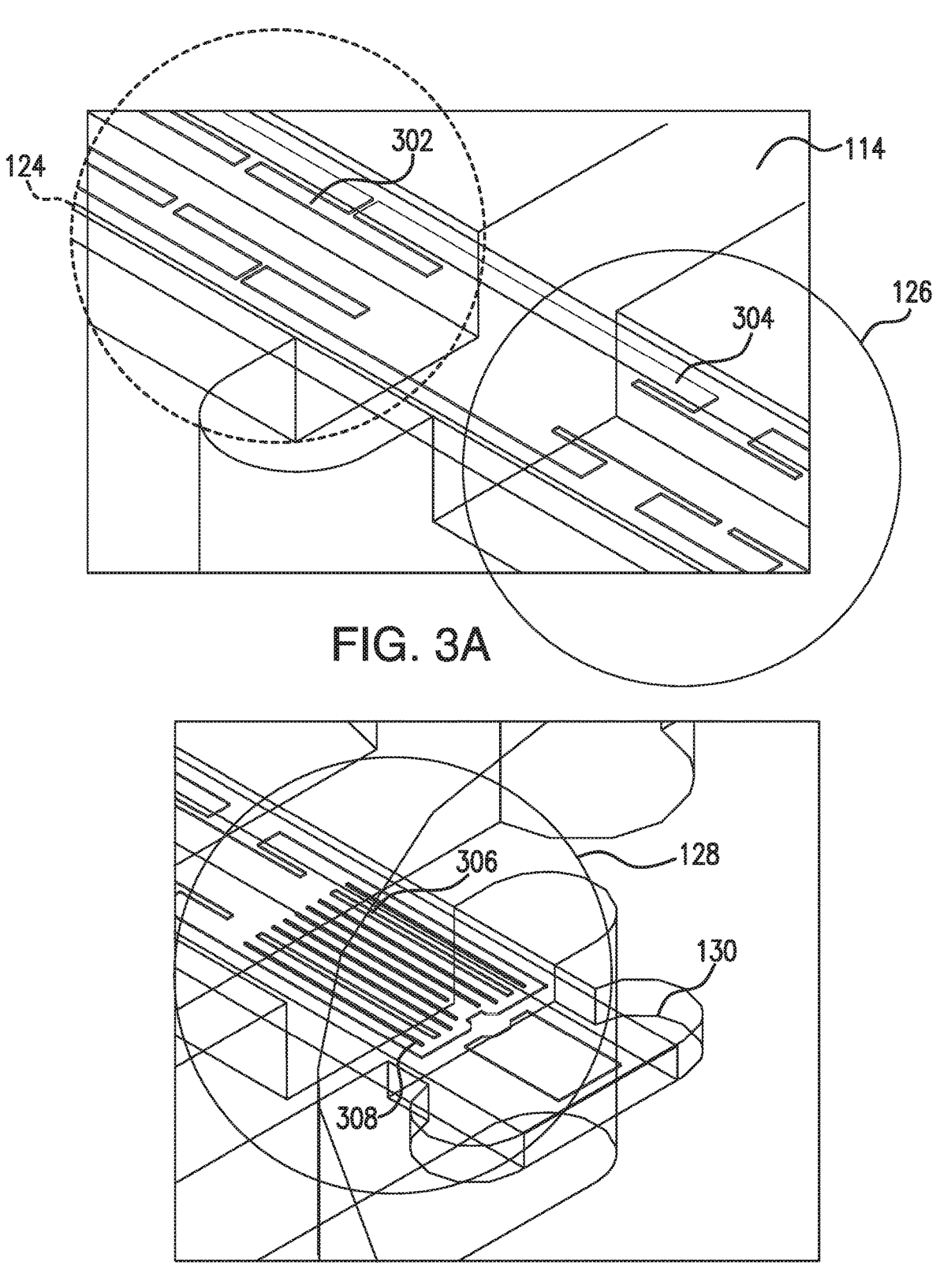
FIGS. 3A and 3B illustrate details of a mixer apparatus according to some embodiments.

FIGS. 3A and 3B illustrate further details of the surface of the waveguide element 108 according to embodiments.

FIG. 3A illustrates an example of LO filtering portion 124 and RF filtering portion 126 on either side of the LO waveguide input 114, according to some embodiments. As shown in the example of FIG. 3A, the patterned transmission line on the surface of suspended waveguide 108 comprises a plurality of slots, which can provide one or more of unwanted mode suppression, filtering, and matching. For instance, a suppression slot can simultaneously provide suppression and filtering. In some embodiments, hammer-head filters 302 can be used and extended in a longitudinal direction to filter LO signals from reaching the IF output 106. Similarly, the half-hammerhead structures 304 provide filtering of spurious RF. In certain aspects, hammerhead (or half-hammerhead) structures can be inductive capacitance combinations that act as effective virtual short circuits spaced at 212, which block the signal from passing, thereby providing filtering.

According to embodiments, the inclusion of slotted suppression features enables a wide center path through the transmission line, which in turn, reduces ohmic losses along the length of the suspended waveguide element as IF signal is passed from the diode circuit 110 to the IF signal output 106. According to embodiments, the thickness of the met-allization layers are at least 3 times the skin depth.

FIG. 3B illustrates an enlarged view of the RF reception element (e.g., antenna) 128, which may be part of RF input 104, according to some embodiments. In this example, the reception element 128 comprises a first set of slots and a second set of slots, wherein the first set 306 are provided for filtering of spurious RF and the second set 308 help to suppress unwanted transmission modes by providing a current break for higher order signals. According to embodiments, the first slots 306 are wider than the second slots 308. Further, and in some embodiments, both the first and second sets 306, 308 are sufficiently narrow that the reception element 128 can provide wideband coupling to the RF input waveguide 116. In the view of FIG. 3B, the diode circuit 110 is not shown, which makes the various metallization layers (e.g., pads) visible, such as pad 122.

According to embodiments, the mixer 100 can be opti-mized for a particular frequency range. For example, the width of the patterned metal features (e.g., filter widths) on the surface of the waveguide element 108 may be set to approximately 0.3-0.4λ, where λ, is the free-space wave-length. For instance, for operation at 375 GHz, the filter channel width may be approximately 0.3 mm. In some embodiments, the mixer is optimized at one of 125 GHz, 250 GHz, and 375 GHz. While specific frequencies/wavelengths are provided in this example, the design and manufacture of the disclosed mixers may be optimized across a wide band of frequencies/wavelengths. For example, mixer 100 may be applicable as a mixer in the microwave, millimeter, and sub-millimeter ranges.

According to embodiments, the center part of the LO and RF filter arrangement is designed to be as wide as possible in order to minimize ohmic losses. In some embodiments, the width of the center line is 30%-50% of the width of the cavity in which the mixer is mounted. In some embodi-ments, the width of the center line is 50% or more of the width of the waveguide substrate. In some embodiments, the width of the line is between 0.1-0.2λ, at the operating frequency. For example, for optimization at 375 GHz, the width of the center line running from the signal end to the IF output end may be approximately 100 microns wide.

In some embodiments, the patterned metal microstrip transmission line comprises a center line that extends from the diode circuit to the output and through one or more filter elements, the width of the center line is equal to or greater than 0.1λ, and less than or equal to 0.2λ, the width of the suspended waveguide element is approximately 0.2λ, and the thickness of the substrate is 0.04λ. The housing cavity may have a width (e.g., in the transverse direction) of approximately 0.35λ, (e.g., between 0.3-0.4λ), and the pat-terned microstrip transmission line is arranged in the cavity to couple an even transmission mode to a sidewall of the housing 132 cavity.

According to embodiments, the mixer 100 can be imple-mented without separate tuning stubs (e.g., wires) or a machined LO filter pin. This can be contrasted, for instance, with the design of WO 2007/125326, which requires one or more stub tuners in the form of extra wires as well as an orthogonal coaxial filter at the IF output to handle LO signal filtering.

According to embodiments, and in order to achieve the highest bandwidth in the RF and LO input circuit, an open circuit waveguide probe is used. This may provide an improvement, as short circuited waveguide are inherently narrow band, often resulting in poor power coupling across the desired band.

Referring now to FIG. 4, a method 400 of operating a mixer according to some embodiments is provided. The mixer may be, for instance, mixer 100 or any other mixer have features shown with respect to FIGS. 1, 2A, 2B, 3A, 3B, and 6A.

The method 400 may begin with step s410, which com-prises receiving an RF signal at a first input of a mixer apparatus having a suspended waveguide element, a plural-ity of suppression elements, and a diode circuit. In step s420, a local oscillator signal is provided to the mixer. In step s430, an intermediate frequency (IF) signal generated by the diode circuit is outputted. According to embodiments, out-putting the IF signal comprises propagating the signal along a longitudinal direction of the mixer (e.g., mixer 100) through a plurality of filters. The filter may be, for example, a part of the plurality of suppression elements. According to some embodiments, the RF signal and LO signal are received and provided along a first axis with respect to the mixer, while the IF is output along a different, perpendicular axis.

Figure 5:
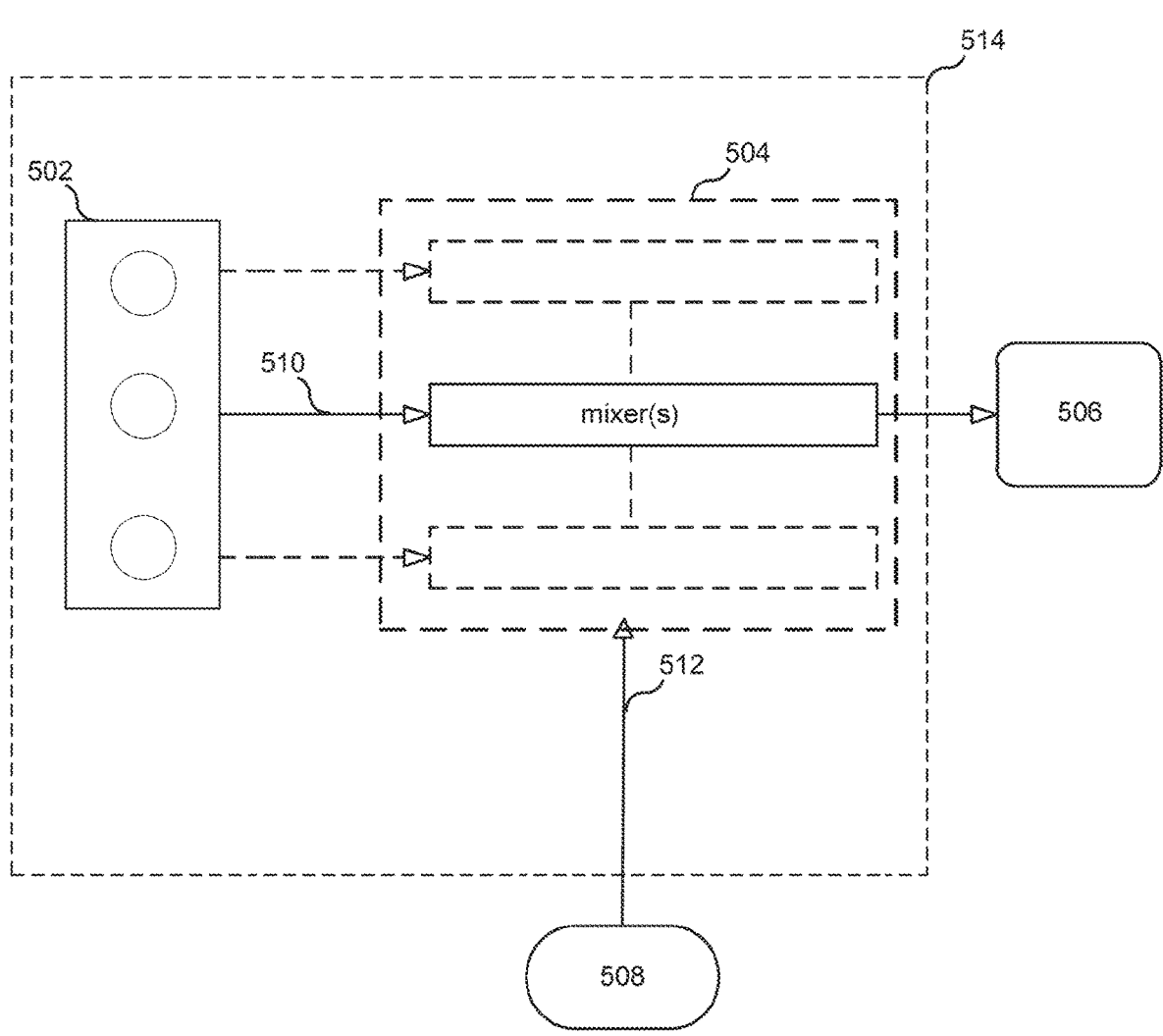
FIG. 5 is a schematic of a detection system according to some embodiments.

Referring now to FIG. 5, a detection system 500 according to some embodiments is provided. In this example, an array of feedhorns 502 provide RF signal to one or more mixers 504, such as mixer(s) 100 described above. The RF signal can be mixed with a LO signal 512 from source 508, such as one or more Gunn oscillator sources. The resultant IF can then be fed to processing circuitry 506 for subsequent processing, including one or more of amplification, filtering, analog-to-digital conversion, and image generation. In some embodiments, the output IF is provided via a coaxial line from the mixers to one or more of the processing circuitry 506. In some embodiments, the feedhorns 502, mixers 504, and signal paths (e.g., 512) can be housed in a block 514. A block for use with one more mixers described herein is illustrated, for instance, with respect to FIGS. 6A-6C.

According to embodiments, the set of mixers 504 includes at least three types of mixers, where a first mixer is optimized a first frequency, a second mixer is optimized at a second frequency, and a third mixer is optimized at a third frequency. In this example, all types of mixers follow the design and configuration of mixer 100 as set forth in FIGS. 1-3. In some embodiments, the frequencies are 125 GHz, 250 GHz, and 375 GHz. In some embodiments, a fourth type of mixer is included using the design and configuration of mixer 100, which is optimized at 500 GHz.

Figure 6A:
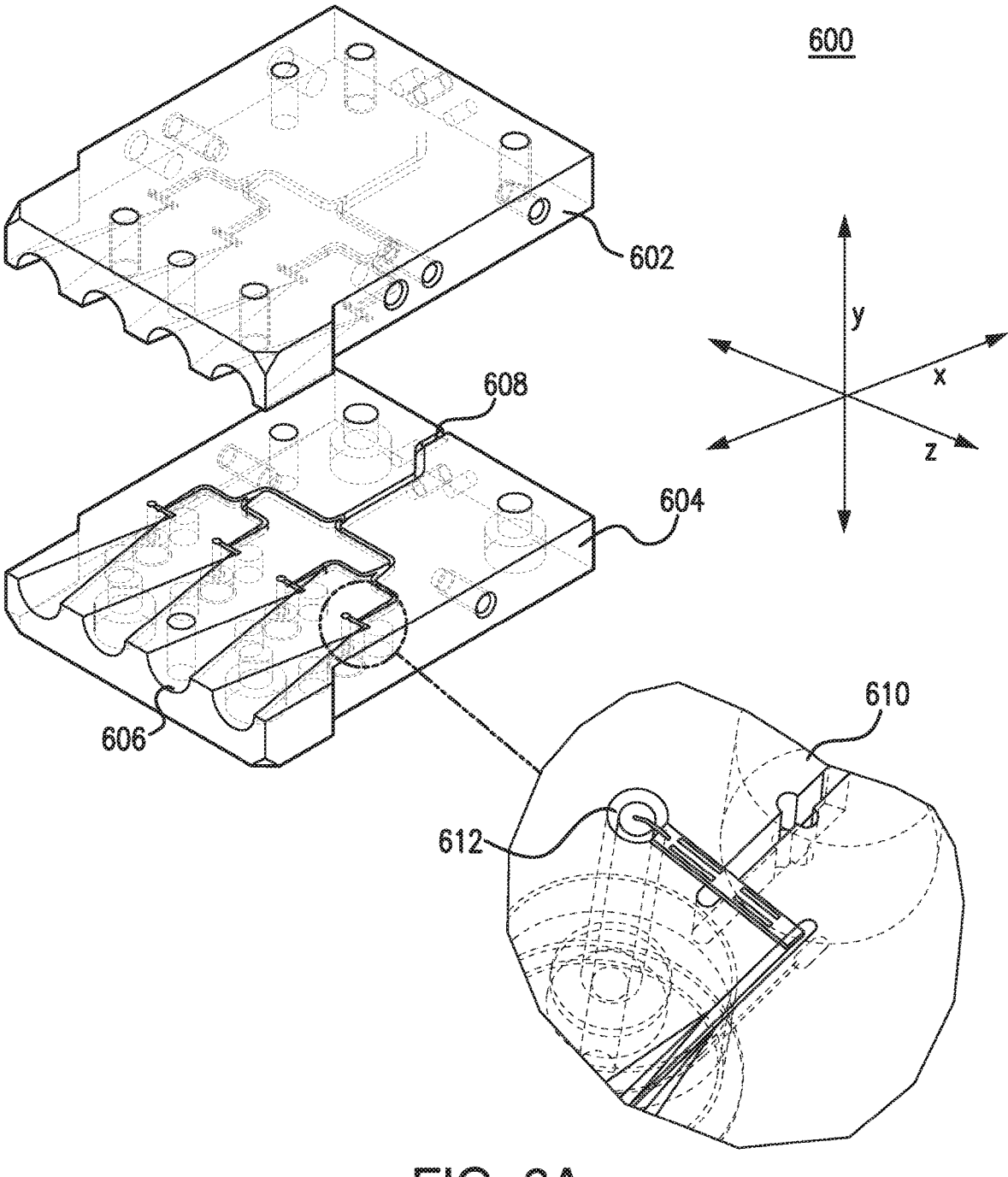
FIGS. 6A-6C illustrate detector blocks according to embodiments.

Referring now to FIG. 6A, two machined halves of a detector block 600 are illustrated according to some embodiments. In this example, the first machined portion 602 can be combined with the second machined portion 604 to form a detector block. The block may comprise, for instance, the housing 132 of mixer 100 and block 514. As shown in FIG. 6A, each of the halves can include one or more feedhorn portions 606, which can serve as channels to deliver RF signals to a mixer 100. Each of the halves may also include input signal (e.g., LO) delivery portions 608, as well mixer cavities, shown in the detail 610. Additionally, and in some embodiments, the mixer can couple its output into a signal output 612 (e.g., containing a coaxial or other transmission line), which can be formed in the respective block halves such that a coaxial cable can run through the mixer housing 132. The output 612 may, for instance, carry IF signals generated by the mixer. According to embodiments, the feedhorns 606 and LO input 608 can be machined along the same axis (e.g., the x-axis) or in the same plane (e.g., the plane formed by the x- and z-axes). Additionally, in some embodiments, the mixer output 612 can be machined in a perpendicular/orthogonal fashion (e.g., along the y-axis). In this respect, the output signals from the mixer can be delivered in a different direction than the direction in which the input signals are received. For instance, signals may be output in a direction perpendicular to the plane in which signals are received.

Figures 6B, 6C:
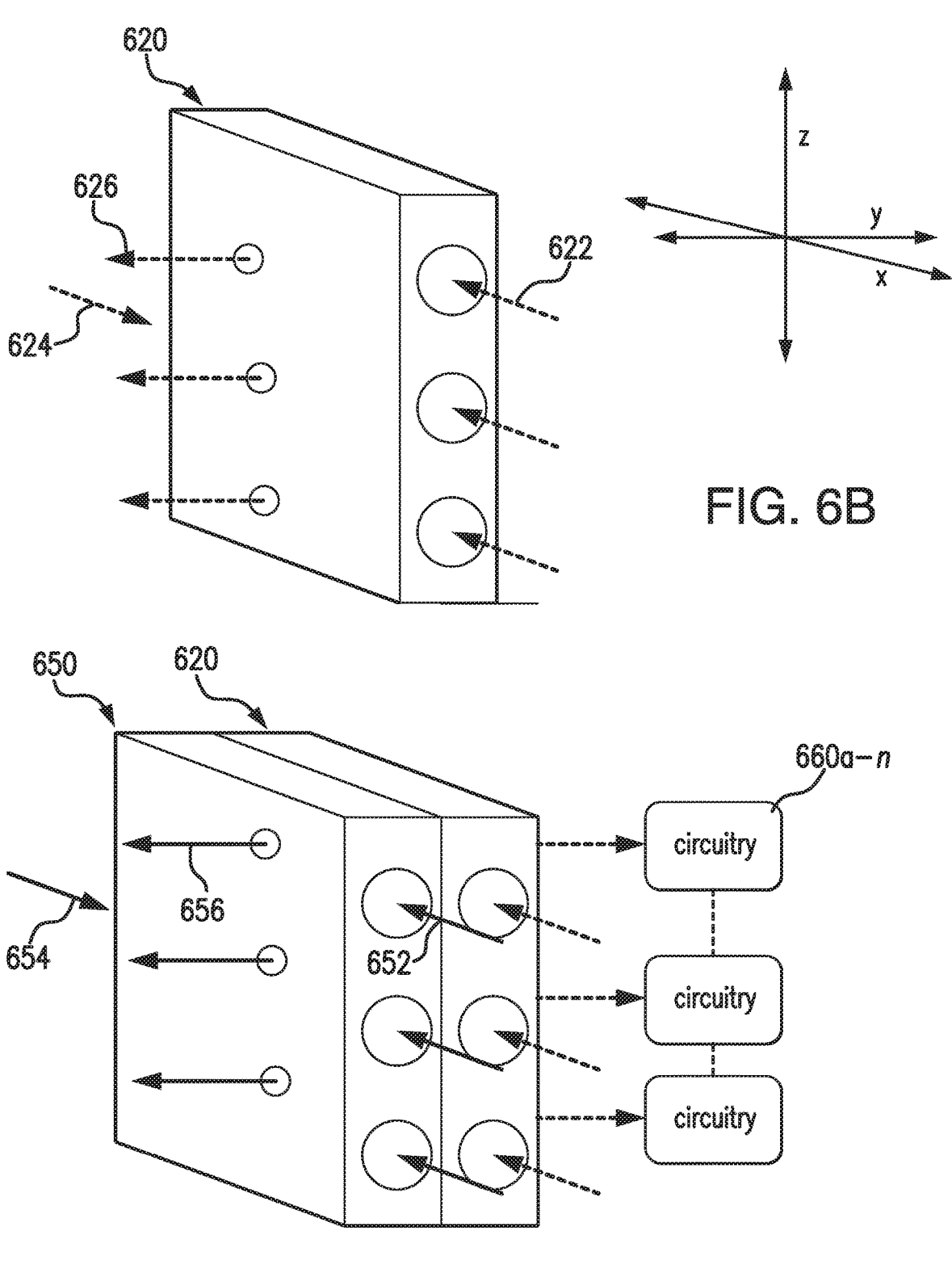

Referring now to FIGS. 6B and 6C, one or more detector array blocks are illustrated according to some embodiments. These may correspond, for instance, to arrays 502 and blocks 514. A detector element, such as block 514 with an array of feedhorns 502, can be formed as a single block (e.g., as shown in FIGS. 6A and 6B). Also it can be formed from multiple blocks (e.g., with two sub-blocks as shown in FIG. 6C) to form a combined detection block with multiple rows and columns of feedhorns. Additionally, and according to embodiments, each sub-block can be formed from two parts as illustrated with respect to FIG. 6A, which shows the attachment of a half-block portion 602 with another half-block portion 604 to form block 600.

Referring now to FIG. 6B, a block 620 according to some embodiments is provided. In some instance, one or more of detector arrays 502 and block 514 may comprise block 620. Block 620 includes one or more signal inputs 622, one or more secondary inputs 624, and one or more outputs 626. For instance, signal inputs 622 may correspond to a plurality of detector feedhorns as illustrated in FIGS. 2, 5, 6A, and 9. Similarly, the secondary input(s) 624 may be an LO signal input, such as described with respect to FIGS. 2, 5, 6A, and 9. The output(s) 626 may be detected signal outputs, such as one or more IF signals from a mixer 100, as described in connection with FIG. 9, for instance. According to embodiments, the inputs are provided in the same plane while the outputs are provided in a transverse plane. In the example of FIG. 6B, the inputs 622, 624 are provided along the x-axis while the outputs 626 are provided along the y-axis. According to embodiments, processing circuitry may be connected to the outputs 626. For example, a plurality of processing circuitry units may be stacked in the z-axis direction to process the signals output from block 620. Likewise, additional blocks may be stacked in the z-axis direction to expand the detector. A similar arrangement is shown in FIG. 6C with elements 660*a-n*. Such circuitry could include, for instance, one or more LNAs, wide-band power detectors, and/or ADCs as illustrated with respect to FIG. 9. In some embodiments, the power detectors are used to convert the broadband microwave power into base-band signals by thermal means (e.g. a bolometer) or by using an amplitude modulation (AM) detector. Additionally, the processing circuitry can include one or more filters, for instance, on either side of the LNA or ADC. According to embodiments, the power detector, such as 921*a*, 921*b*, 921*c*, detects power across the entire band, and outputs a voltage related to the power.

Referring now to FIG. 6C, and according to embodiments, a first block (e.g., block 620) can be combined with a second block (e.g., 650) to form a single detection array block, such as block 514 with array 502. In this example, the inputs 652 and 654 of block 650 are provided in a single plane along the x-axis and the outputs 656 are provided in a perpendicular direction extending along the y-axis. Given the arrangement of the inputs and outputs, the processing circuitry 660*a-n* can be stacked at an outer surface of the blocks 620,650 in the z-axis direction without interfering with signal capture from a source by inputs 652, or blocking delivery of the LO to input 654. Although the circuitry 660*a-n* is shown on the block 620-side of the array, the stack may also be provided on the other side of the array (e.g., the block 650-side). In this respect, a first stack 660*a-n* of processing circuitry may be provided on one side of the array, a second stack 660*a-n* of processing circuitry may be provide on a second side of the array, an input signal (e.g., RF input) may be provided on a third side of the array, and in some embodiments, another input signal (e.g., LO) can be provided on a fourth side of the array. The circuitry 660*a-n* may comprise, for instance, one or more LNAs, AM (envelope) power detectors, and/or ADCs, and in some cases, filters.

Although the array of FIG. 6C is depicted with two, connected blocks, embodiments are not so limited. For instance, according to embodiments, detector arrays can be formed of blocks that are not directly connected, and with more than two blocks. For example, processing circuitry 660*a-n* could be interposed between two sub-blocks of an array (e.g., between blocks 620 and 650). In some instances, three sub-blocks could be used with circuitry interposed between the first and second block, and between the second and third block. In such an arrangement the circuitry between the first and second block could process signals from one or both of the first or second blocks, while circuitry between the second and third block could process signals from one or both of the second and third blocks. Additionally, another circuitry stack could be provided on one or more of the outer sides of the array, for instance, to process signals from the first or third block. While described using three blocks, according to embodiments, this arrangement could be repeated to expand the width of the array beyond three blocks. Detection arrays can also be expanded in the z-direction, for instance, by stacking additional blocks 620, 650. According to embodiments, there are no inputs or outputs on the upper and lower surfaces of an array block 620,650, and thus, it can be stacked with another block without interference. Some embodiments include a block 620,650 with six primary sides, with inputs and/or outputs exposed on outer sides (e.g., inputs and/or outputs in the x- and y-directions through the block), but not on the top or bottom (e.g., in the z-direction).

According to embodiments, a detection system may be optimized for up to four detection frequency bands. According to embodiments, the width of the band may be set by a combination of the mixer, IF amplifier, and/or an envelope detector. In some embodiments, the band is +/−20% of the center frequency for the waveguide.

Figure 7:
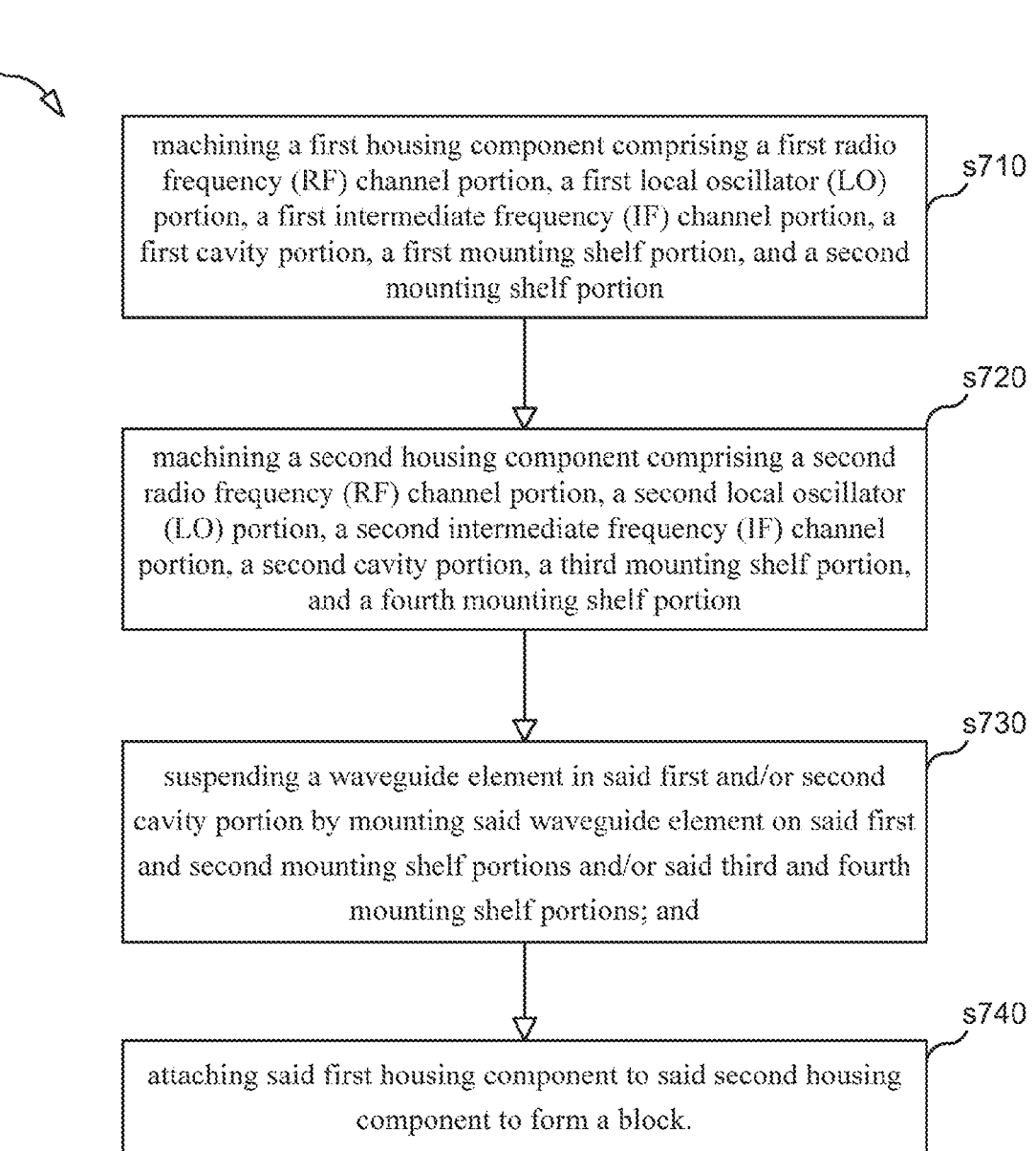
FIG. 7 is a flow chart illustrating a process according to some embodiments.

Referring now to FIG. 7, a method 700 of fabricating a mixer apparatus is provided according to some embodiments. This method may be used, for instance, to fabricate a mixer 100 as illustrated with respects to FIGS. 1-3, as well as to form the machined portions 602, 604 shown in FIG. 6A.

The method 700 may begin with step s710, which comprises machining a first housing component (e.g., 602) comprising a first radio frequency channel portion, a first local oscillator portion, a first intermediate frequency channel portion, a first cavity portion, a first mounting shelf portion, and a second mounting shelf portion. In step s720, a second housing component (e.g., 604) is machined, which comprises a second radio frequency channel portion, a second local oscillator portion, a second intermediate frequency channel portion, a second cavity portion, a third mounting shelf portion, and a fourth mounting shelf portion. The method may further comprise suspending (s730) a waveguide element in the first and/or second cavity portion by mounting the waveguide element on the first and second mounting shelf portions and/or the third and fourth mounting shelf portions. This could be, for example, waveguide element 108. The method 700 may further comprise attaching (s740) the first housing component to the second housing component to form a block. For instance, this method may be used to form a block (or blocks) as illustrated in FIGS. 6B and 6C.

According to embodiments, two halves of a complete feedhorn are machined in each half of a block using a bullnose cutter and a five axis machine. This allows for flexibility in horn geometries to be used, such as an oval section horn. This can allow the feedhorn beam pattern to be adjusted to achieve optimal optics coupling. For instance, a circular horn provides an oval beam, which must be corrected in the optics otherwise the image can have improper stigmatism. An oval feedhorn, however, can achieve a circular beam which does not need correcting. Thus, and according to some embodiments, a feedhorn (e.g., to deliver received RF to the mixer 100) may have an oval shape.

Referring now to FIGS. 8A and 8B, electric and magnetic fields are illustrated. For instance, FIG. 8A illustrates transverse electromagnetic modes 802. Where the microstrip outer channel is less than one-half of the guide wavelength, typically, only the fundamental Transverse EletroMagnetic mode (TEM-00) mode can exist. In this instance the electric field lines and magnetic field lines are transverse and propagate from the inner conductor to the outside of the metal channel in the same direction or loop around the filter metallization in the same direction respectively as shown by 802 (conductor in air, in this example). Operation in the fundamental TEM-00 mode can result in a very smooth impedance versus frequency response, for instance, as shown at 804, which depicts the transmission passband. This arrangement is further illustrated by 808, with a circuit line (e.g., gold) 810 on a quartz substrate 812.

The effective microstrip filter metallization width and outer channel width dimensions scale inversely as a function of frequency and so at higher frequencies the width of the filter metallization pattern and the channel it sits in gets very small, and both become challenging to manufacture, thereby increasing cost if the dimensional condition that the outer width of the channel stays below one half guide wavelength. If this condition cannot be met (e.g., either is more than one half guide wavelength), higher order transverse and longitudinal modes can be excited (e.g., by discontinuities in the channel or filter) and propagate. This situation is illustrated by 814. The electric and magnetic field lines are then no longer uniform and resonant conditions can be created, resulting in non-uniform behavior as a function of frequency and resulting in reflected power as shown by 806, where resonance appears in the passband. These resonances can reduce the smooth, broadband operation of the mixer.

Often a microstrip filter will cascade quarter-wavelength low and high impedance sections. The finesse of the filter is best when the ratio of the high to low impedance sections is greatest, which is achieved using the narrowest and widest lines. This is illustrated by 822 and 824, respectively, in FIG. 8B. The performance of such filters is therefore fundamentally limited when the generation of higher order modes is considered as there is a finite width before the higher order modes are excited and resonant reflections are introduced into the filters frequency response. Aspects of the disclosure can provide the benefits of wider lines (e.g., lower impedance and improved filtering) without the negative effects of higher order mode propagation. This can be achieved, for instance, through the inclusion of current breaks or slots along the length of filter sections as shown in 830 of FIG. 8B. This is contrasted with 826, where the current flows un-interrupted and generates non-ideal passband performance as illustrated in 828. When higher order modes are created the current flow no longer occur just along the longitudinal direction as in the case of the fundamental mode, but also run across the lateral direction of the filter metallization. With the introduction of current breaks, these transverse currents are interrupted and the excitation of a higher order mode suppressed, even though the width of both the filter section and channel would otherwise allow it. A much lower impedance filter section is achieved along with a smooth filter frequency behavior as shown in 832.

Figure 9:
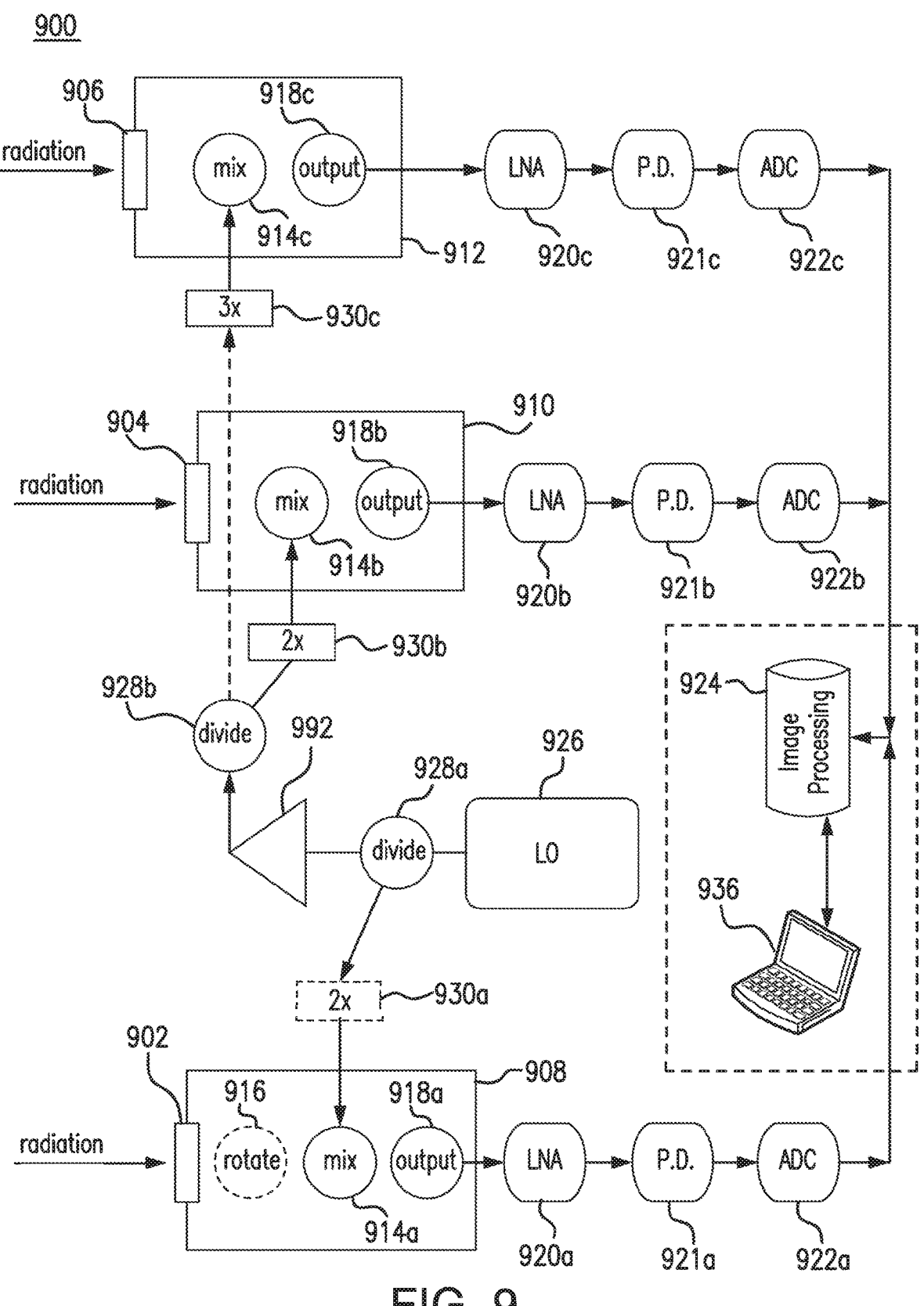
FIG. 9 illustrates a detection system, such as a terahertz camera, according to embodiments.

Referring now to FIG. 9, a schematic depiction of a detection system 900 according to some embodiments is provided. In some embodiments, system 500 can be implemented using the arrangement of FIG. 9.

Radiation can be received at inputs 902, 904, and 906, which may be feedhorns of block 908, 910, and 912, respectively. In some embodiments, blocks 908, 910, and 912 may each form a part of detector array 502, 514, 600, 620, and/or 650. The radiation signals received at inputs 902, 904, 906 are each passed to a mixer element, depicted as elements 914a, 914b, and 914c. This could be, for instance, a mixer 100. In some embodiments, one or more of the received signals may be rotated before processing by a mixer, for instance, by optional polarization rotation element 916. The processed signals from the mixer, such as one or more intermediate frequency (IF) signals, are passed to the output (918a, 918b, 918c) of each block for subsequent processing by a low noise amplifier (LNA) (920a, 920b, 920c), power detector (921a, 921b, 921c), and analog to digital converter (ADC) (922a, 922b, 922c). Additional processing may include filtering. The digital signals may then be passed to image generator 924 to form an image based on the detected radiation, such a composite image of an object or scene using the radiation received at 902, 904, and 906. The image processing 924 may be coupled to, or part of, a viewing system 936, such as a computer or monitor. In some embodiments, the IF signals are outputted using coaxial cable within each block.

Although this system is depicted with three mixer elements or inputs, it could be implemented with more or less. For instance, the system 900 could be extended to include a fourth set of input feedhorns, each with a corresponding set of mixers and processing circuitry. Additionally, each of blocks 908, 910, and 912 may comprise an array of inputs, and multiple mixers 100. Information may be processed by a stack of circuitry as illustrated in FIG. 6C.

In some embodiments, the local oscillator (LO) signal is provided to the mixers of system 900 using fewer LO sources than mixers. For instance, in the example illustrated in FIG. 9, a single LO source 926 provides an LO signal to each of mixers 914a-c. According to embodiments, this is accomplished using one or more power dividers 928a, 928b, and in some instances, one or more frequency multipliers 990a-c, such as doublers or triplers. For example, an original LO signal from source 926 could be provided to divider 928a, which in turn provides signal to divider 928b and an optional multiplier 990a. The multiplier 930 may be used to provide mixer 914a with an LO signal at a higher frequency than is provided by source 926. Similarly, divider 928b may provide signal to optional multipliers 930b and 930c for mixers 914b and 914c. In this respect, each of blocks 908, 910, and 912 can be configured for operation at different frequencies/wavelengths. Such configuration could include, for instance, the mixer design as well as the shape and dimensions of the input feedhorns. Accordingly, different wavelength radiation signals may be detected, processed, and used by the processing circuitry 924 to form a composite image using data at multiple wavelengths. One or more amplifiers, such as amplifier 992 may be used to boost a signal between a source, divider, multiplier, and/or mixer. Other amplifiers are not illustrated in the example of FIG. 9.

The feedhorn size should be selected to provide the most optimum coupling to the chosen optics, and the spacing should be selected to provide the optimum coverage depending on the application.

In certain aspects, components are optimized to minimize the amount of LO power reflected from the RF coupling circuit over as wide range of circuit operating conditions as possible. This limits reflected LO signal propagating back into one or more LO power splitters, thus limiting interference between channels. To further reduce reflection issues, a 90 degree 3 dB hybrid power splitter such as a Magic-T or a 3 dB hybrid branch guide coupler could be implemented.

While illustrated with a single LO 926, multiple LOs may be used according to embodiments.

According to some embodiments, one or more of dividers 928a and 928b is a non-equal divider. According to some embodiments, multipliers 930a and 930b are doublers while multiplier 930c is a tripler. In some embodiments one or more of the multipliers is not needed. For example, multiplier 930a may be omitted in some embodiments.

According to some embodiments, a common local oscillator source 926 is provided, multiplied in frequency using different order frequency multipliers (e.g., doublers and triplers), and subharmonic mixers are implemented. For example, mixers 914a-c may be operating in bands centered on the frequencies 125 GHz, 250 GHz and 375 GHz, respectively, which can use local oscillator frequencies of 62.5 GHz, 125 GHz and 187.5 GHz. In this example, the base local oscillator source 926 may be a Gunn oscillator providing approximately 100 mW operating at 62.5 GHz. This is split into two equal signals using a splitter, such as divider 928a. This may be an equal power splitter, such as a standard magic-tee, or a non-equal splitter. One half of the splitter output pumps the 125 GHz array (block 908 in this example), and the second half is input into a power amplifier (e.g., amplifier 992 in this example) to give a signal of approximately 400 mW that is then used to pump frequency multipliers 930b and 930c. Given the use of a subharmonic mixer at the example frequencies, the multiplier 930a is not required in this instance. In some embodiments, the system is optimized by using a configurable, non-equal power divider to provide the optimum power to the 125 GHz array and power amplifier. Each frequency mixer array requires similar local oscillator power, 30-40 mW in this example. However the typical efficiency of a doubler is 40% whereas a tripler is 15%. This means that use of an equal power splitter such as a magic-tee can result in too much power (80 mW) being generated for the 250 GHz array (e.g., block 910 in this example) and marginal power for the 375 GHz array (e.g., block 912 in this example). Traditional power splitters such as magic-tees rely on the input power being split equally in half, however, if such an approach is used for this embodiment, it may result in too much power being supplied to the 125 GHz doubler (e.g., multiplier 930b) and not enough power being supplied to the 187.5 GHz tripler (e.g., multiplier 930c). Therefore in order to supply sufficient power to the tripler, which is typically less efficient than a doubler, the power amplifier would need to be over specified and the power to the doubler would be unnecessarily attenuated (otherwise it can be damaged). Thus, and according to embodiments, a configurable power divider is used that can split the local oscillator pump power arbitrarily into two or more pathways, thereby dividing the power for each local oscillator arm's multipliers according to their respective power requirements. According to embodiments, dividers 928a and/or 928b are configurable. Thus, a system can be provided in which the overall system LO power requirement (and thereby cost) is minimized by matching the power split to each frequency arm so that the power delivered matches the peak efficiency input power requirement for each respective multiplier.

According to some embodiments, one or more blocks that is configured to receive and process radiation at a fourth frequency may be provided. For instance, one or more blocks may be configured at 500 GHz. The mixer for such a block could similarly operate using the same LO source, for instance, with an additional divider and or doubler in one or more of the LO paths shown in FIG. 9. In some embodiments, the block may be a sub-block or array 514, 620, and/or 650.

According to some embodiments, the LO source 926 may have multiple outputs at one or more frequencies, and initial divider 928*a* and/or multiplier 930*a* may not be required. In some embodiments, one or more of divider 928*a* and multiplier 930*a* are integrated into the local oscillator source 926, such that source 926 provides multiple frequency signals at configurable powers. Although two outputs are used by way of example, this implementation could be extended through the use of additional non-equal power splitters and/or multipliers.

Earth's atmosphere provides unique illumination characteristics according to the observed frequency transmission through the atmosphere, which in turn is determined by the amount of water vapor present above the scene and the wavelength being used for detection. Two phenomena dominate this effect. Firstly, a water molecule has rotation resonances in the millimeter to terahertz domain so that at particular frequencies it absorbs photons. At frequencies away from these lines it passes photons, which may be understood as the water window. In addition, as the wavelength shortens the effective path length through the atmosphere becomes longer increasing the attenuation. At frequencies where the transmission is highest, Earth's atmosphere is transparent and so the cold background of space provides very high contrast during millimeter-wave detection. Thus, an outdoor scene under observation is dominated by the "cold" sky illumination. At frequencies where the transmission through Earth's atmosphere is low, the scene is dominated by the "warm" illumination from the column of air above the scene. According to embodiments, and in order to provide a color scene where different contrast types are achieved, a mixture of high transmission moderate transmission and low transmission wavelengths can be used. Through experimental research, these have been determined to be ~35 GHz wide bands centered around 125 GHz, 250 GHz and 375 GHz.

Although embodiments use 125 GHz, 250 GHz, 375 GHz, and 500 GHz as examples, other sets of frequencies may be used. For instance, 60, 120, 240, 360 and 480 GHz may be used. This set of frequencies relates to the absorption properties of oxygen in the atmosphere.

While various embodiments of the present disclosure are described herein, it should be understood that they have been presented by way of example only, and not limitation. Thus, the breadth and scope of the present disclosure should not be limited by any of the above-described exemplary embodiments. Generally, all terms used herein are to be interpreted according to their ordinary meaning in the relevant technical field, unless a different meaning is clearly given and/or is implied from the context in which it is used. All references to a/an/the element, apparatus, component, means, step, etc. are to be interpreted openly as referring to at least one instance of the element, apparatus, component, means, step, etc., unless explicitly stated otherwise. Any combination of the above-described elements in all possible variations thereof is encompassed by the disclosure unless otherwise indicated herein or otherwise clearly contradicted by context.

Additionally, while the processes described above and illustrated in the drawings are shown as a sequence of steps, this was done solely for the sake of illustration. Accordingly, it is contemplated that some steps may be added, some steps may be omitted, the order of the steps may be re-arranged, and some steps may be performed in parallel. That is, the steps of any methods disclosed herein do not have to be performed in the exact order disclosed, unless a step is explicitly described as following or preceding another step and/or where it is implicit that a step must follow or precede another step.

What is claimed:

1. A heterodyne mixer apparatus, comprising:
   a first input;
   a second input;
   an output;
   a suspended signal transmission element comprising a plurality of suppression slots and at least one filter element; and
   a diode circuit mounted on the suspended signal transmission element,
   wherein the suspended signal transmission element further comprises:
   a substrate having a first and second surface; and
   a transmission line on the first surface, wherein the transmission line is a patterned metal microstrip transmission line comprising one or more of the suppression slots and filter elements.

2. The apparatus of claim 1, wherein the first input is a local oscillator (LO) input, the second input is a radio frequency (RF) input, the output is an intermediate frequency (IF) signal output, and the suspended signal transmission element is a waveguide element.

3. The apparatus of claim 2,
   wherein the suspended signal transmission element comprises a first filter element for LO signals and a second filter element for RF signals, and
   wherein each of the first filter element and second filter element comprise one or more of the plurality of suppression slots.

4. The apparatus of claim 3,
   wherein each of the first filter element and second filter elements comprise one or more hammerhead or half-hammerhead filter components.

5. The apparatus of claim 1,
   wherein the first input is located between the second input and the output, and
   wherein the suspended signal transmission element is configured to transmit a signal generated in the diode circuit along a longitudinal axis of the element from the diode circuit to the output.

6. The apparatus of claim 5, wherein the signal generated in the diode circuit is an IF signal.

7. The apparatus of claim 1, wherein the apparatus further comprises:
   a housing having a first mounting shelf, a second mounting shelf, and a cavity,
   wherein the suspended signal transmission element is mounted in the cavity and on the first and second mounting shelves to form an air gap between the suspended element and the housing on at least two sides of the suspended waveguide.

8. The apparatus of claim 7, wherein the housing is made of machined metal and the air gap is formed on four sides of the suspended element.

9. The apparatus of claim 7, wherein the suspended element extends between the first and second mounting shelfs along a longitudinal direction of the mixer apparatus.

10. The apparatus of claim 1, wherein the apparatus further comprises:
    a housing,
    wherein the housing comprises:
    a first channel coupled to the first input;
    a second channel coupled to the second input; and
    a third channel coupled to the output, wherein the first and second channels are provided along the same plane of the housing and the third channel is provided along a direction perpendicular to the plane.

11. The apparatus of claim 1, wherein the diode circuit comprises two Schottky diodes, in an anti-parallel configuration.

12. The apparatus of claim 1, wherein the patterned metal microstrip transmission line comprises a center line that extends from the diode circuit to the output and through one or more filter elements.

13. The apparatus of claim 1, wherein the apparatus further comprises:
a housing having a cavity,
wherein the patterned microstrip transmission line is arranged in the cavity to couple an even transmission mode to a sidewall of the housing cavity.

14. The apparatus of claim 1, wherein the apparatus further comprises:
a housing having a cavity;
a first wire connected to the output; and
a second wire connected to an inductively tuned capacitive pad and a surface of the housing,
wherein the diode circuit is at least partially mounted to the inductively tuned capacitive pad.

15. The apparatus of claim 1,
wherein the plurality of suppressions slots comprise a plurality of gaps on a surface of the suspended signal transmission element, and
wherein each of the plurality of gaps is elongated along a longitudinal direction of the suspended element.

16. The apparatus of claim 1, wherein the suspended signal transmission element comprises a single waveguide element suspended between an RF input and an IF output.

17. The apparatus of claim 1, wherein the diode circuit located at the second input, and wherein the second input is an RF input.

18. The apparatus of claim 1, wherein the suspended signal transmission element comprises an RF antenna on a surface of the suspended signal transmission element.

19. A detector apparatus, comprising:
one or more mixers;
one or more feedhorns coupled to a radio frequency (RF) input of at least one of the mixers;
a local oscillator coupled to a local oscillator (LO) input of the at least one mixer;
an output channel coupled to an intermediate frequency (IF) output of the at least one mixer; and
one or more of a low noise amplifier, power detector, and analog-to-digital converter connected to the output channel and configured to process an output IF signal from the at least one mixer,
wherein the at least one mixer comprises:
a suspended signal transmission element comprising a plurality of suppression slots and one or more filter elements; and
a diode circuit mounted on the suspended signal transmission element,
wherein the detector is a terahertz camera, and
wherein the one or more mixers comprises a plurality of mixers optimized at 250 GHz and a plurality of mixers optimized at 375 GHz.

20. The detector of claim 19, wherein the diode circuit is arranged to generate the IF output signal based on radiation received on one or more of the feedhorns and a power signal from the local oscillator.

21. The detector of claim 19,
wherein the detector is a terahertz camera,
wherein the one or more mixers comprises a plurality of mixers optimized at 125 GHz.

22. A heterodyne mixer apparatus, comprising:
a first input;
a second input;
an output;
a suspended signal transmission element comprising a plurality of suppression slots and at least one filter element;
a diode circuit mounted on the suspended signal transmission element; and
a housing having a first mounting shelf, a second mounting shelf, and a cavity,
wherein the suspended signal transmission element is mounted in the cavity and on the first and second mounting shelves to form an air gap between the suspended element and the housing on at least two sides of the suspended waveguide.

23. A heterodyne mixer apparatus, comprising:
a first input;
a second input;
an output;
a suspended signal transmission element comprising a plurality of suppression slots and at least one filter element;
a diode circuit mounted on the suspended signal transmission element;
a housing having a cavity;
a first wire connected to the output; and
a second wire connected to an inductively tuned capacitive pad and a surface of the housing,
wherein the diode circuit is at least partially mounted to the inductively tuned capacitive pad.

\* \* \* \* \*